Oct. 3, 1967 R. TRACY 3,345,580
STARTING ARRANGEMENT FOR FLUX OSCILLATOR
Filed March 1, 1965
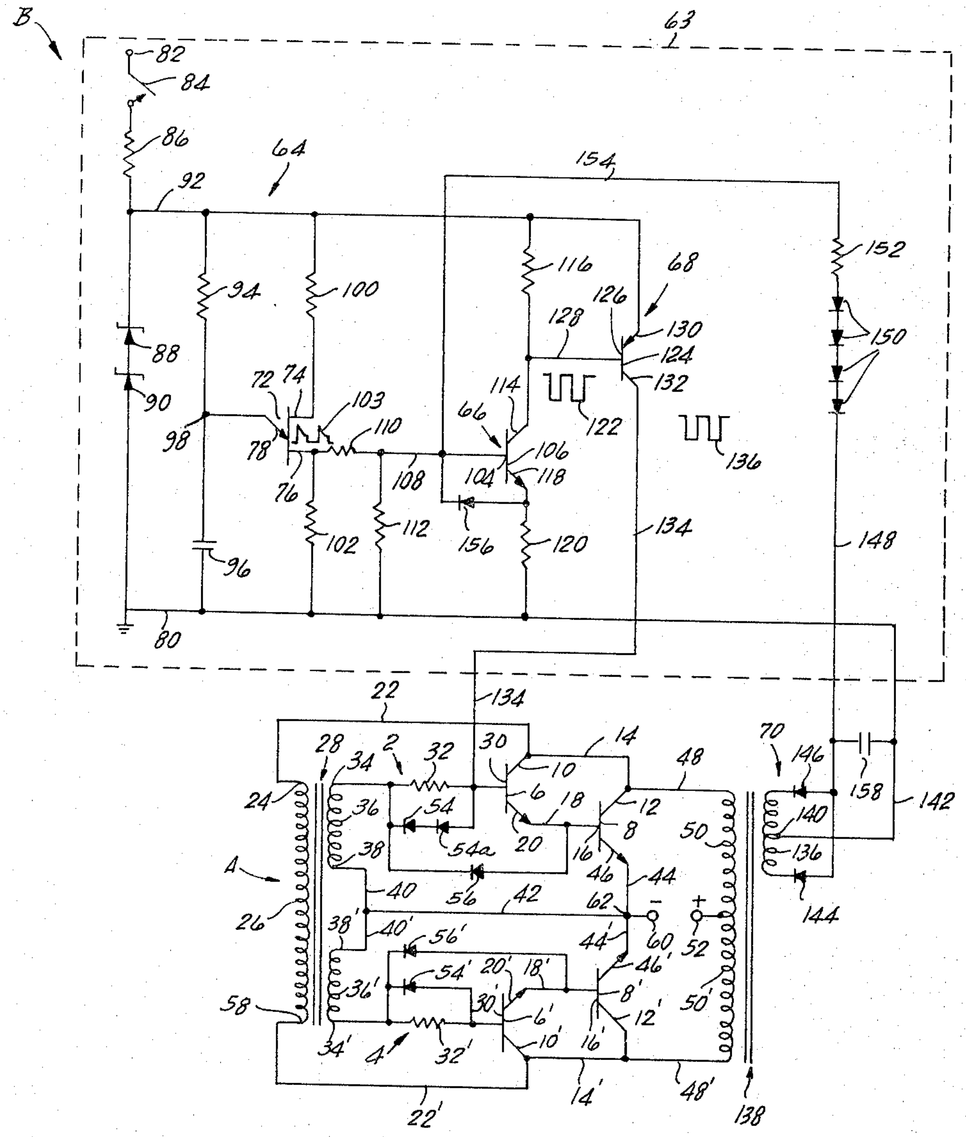
INVENTOR
ROGER TRACY
BY James and Franklin
ATTORNEY United States Patent Office 3,345,580
Patented Oct. 3, 1967

3,345,580
STARTING ARRANGEMENT FOR FLUX OSCILLATOR

Roger Tracy, Wallingford, Conn., assignor to Technipower Incorporated, South Norwalk, Conn., a corporation of Connecticut Filed Mar. 1, 1965, Ser. No. 435,939
14 Claims. (Cl. 331—52)

ABSTRACT OF THE DISCLOSURE

A flux-oscillator-type power supply is provided with a positive starting arrangement consisting of an oscillator circuit, a separate amplifier and, preferably, a separate pulse-forming transistor, the output of the starting arrangement being applied to the control electrode of one of the transistors in the power supply proper, a special rectifier being connected to that control electrode so as to provide proper transistor-starting bias thereon when the output from the starting arrangement is fed thereto, together with a feedback circuit operatively connected between the output of the power supply and the amplifier so as to disable the amplifier but not the oscillator when the power supply output reaches a predetermined value.

The present invention relates to means for ensuring the starting of a flux-oscillator-type power supply.

Flux-oscillator-type power supplies comprise a pair of transistor circuits interconnected so as to be alternately conducting, thereby to produce an alternating voltage or current in the output circuit to which they are both connected. The control electrodes (usually the bases) of the transistors in the circuits are transformer-coupled to the output circuit in such a fashion that when one transistor is conductive the current flowing through the transformer, usually by means of a saturation effect, biases that transistor so as to render it non-conductive and biases the other transistor so as to render it conductive. The sequence continues, conductivity shifting from one transistor to the other, in order to produce the desired alternating output. Once such circuits start to oscillate in this fashion they usually will continue to oscillate for as long as they are energized. However, the starting of oscillation in circuits of this type presents a problem.

The most common approach to this problem is to provide a resistor operatively connected to one of the transistors and effective to provide an initial on-biasing of that transistor when the circuit is energized. Such resistors are effective starting instrumentalities, but they have the drawback of constantly carrying output-circuit current, and hence dissipating power of appreciable amounts during all the time that the oscillator is functioning. This is not only a source of inefficiency (power loss), but also constitutes a source of heat. This is a significant drawback, since the heat-tolerating ability of transistors is limited, and the oscillation frequency of the circuits is often quite temperature-sensitive.

The prime object of the present invention is to provide a starting arrangement for flux oscillator circuits which minimizes the power loss during the time that the oscillator circuit is functioning and which subjects the transistors in the oscillator circuit to little or no heat, thereby increasing their reliability, accuracy of operation and longevity.

This is accomplished, in accordance with the present invention, by using separate circuitry which provides a starting pulse of appropriate magnitude to one of the transistors of the flux oscillator circuit, thereby rendering that transistor conductive. The output circuit of the flux oscillator has a feedback connection to the pulse-producing circuitry such that when the flux oscillator is functioning and a predetermined alternating voltage or current is present in its output circuit, the pulse-producing circuit is disabled, thereby permitting the flux oscillator to function in normal fashion.

In the preferred form here specifically disclosed the transistor-starting pulse is produced by a separate transistor operated in a switching mode and controlled by means of a conventional oscillator circuit the output of which is appropriately amplified so as to switch the pulse-producing transistor then remaining in "off" condition. The conventional oscillator continues to function, but because of the low power involved in its oscillations the power drain and the amount of heat produced are both minimal. Moreover, the starting circuit may be located relatively remote from the flux-oscillator itself, so that whatever heat is produced by the oscillations will have no appreciable effect on the transistors which are active in the flux-oscillator circuit per se.

The base circuits of the flux-oscillator transistors are preferably provided with resistors in order to limit the base current during turn-on, and these resistors are bypassed by rectifiers so that a large turn-off current can flow, thus making the turn-off more abrupt. Additional rectifiers means are preferably added in series with the bypass rectifier associated with the transistor to which the starting pulse is applied, thereby to ensure that a starting bias of proper magnitude is provided by the starting pulse. This is particularly valuable when the transistor arrangement in the two halves of the flux-oscillator circuit comprise a plurality of transistors, as is the case when a comparatively large power output is desired from the flux-oscillator circuit.

To the accomplishment of the above, and to such other objects as may hereinafter appear, the present invention relates to an arrangement for the starting of flux-oscillator circuits and the like, as defined in the appended claims and as described in this specification, taken together with the accompanying drawing which constitutes a circuit diagram of a preferred embodiment of the invention.

In the embodiment specifically here disclosed, the flux-oscillator, generally designated A, comprises a pair of circuits generally designated 2 and 4 respectively, which are adapted to be alternately rendered conductive. The circuit 2 comprises a pair of transistors 6 and 8 connected in the well known "Darlington" connection, the collectors 10 and 12 of the transistors 6 and 8 being connected together by lead 14 and the base 16 of transistor 8 being connected by lead 18 to the emitter 20 of transistor 6. This type of connection is often used when more power is to be handled than can readily be carried by a single transistor. The collector 10 of the transistor 6 is connected by lead 22 to one end 24 of the winding 26 which forms a part of the saturable transformer 28. The base 30 of the transistor 6 is connected via resistor 32 to the end 34 of the winding 36 on the transformer 28, the other end 38 of the winding 36 being connected by leads 40, 42 and 44 to the emitter 46 of the transistor 8. The collector 12 of the transistor 8 is connected by lead 48 and coil 50 to the positive input terminal 52. A rectifier 54 is connected in parallel with the resistor 32 between the base 30 of transistor 6 and the end 34 of the winding 36, and a rectifier 56 is connected between lead 18 and the end 34 of winding 36. The circuit 4 is similar to the circuit 2, and similar reference numerals are applied to the parts thereof as are applied to the corresponding parts of the circuit 2, differentiated, however, by being primed, the lead 22' from the collector 10' of the transistor 6' going to the opposite end 58 of the winding 26. The negative input terminal 60 is connected to point 62 which represents the junctions of leads 42, 44 and 44'.

The circuit thus disclosed will be seen to constitute a flux oscillator. When the transistors 6 and 8 are conductive, as will be the case when the base 30 of transistor 6 is appropriately biased, collector-emitter current will flow from positive terminal 52 up through winding 50 and through the collector-emitter paths of the transistors 6 and 8 to the negative terminal 60. This will induce a downwardly flowing current in the winding 50′ which will flow through leads 48′, 14′ and 22′ and then upwardly through winding 26. As the current through winding 26 builds up and the core 28 saturates the windings 36 and 36′ will respectively bias the base of transistor 6 to cause transistors 6 and 8 to become non-conductive and bias the base 30′ of transistor 6′ to render transistors 6′ and 8′ conductive. Thereafter collector-emitter current will flow from positive terminal 52 downwardly through winding 50′, thus inducing an upwardly flowing current in winding 50 which will flow downwardly through winding 26. As this current builds up the transistors 6′ and 8′ will be cut off and the transistors 6 and 8 will be biased so as to be again conductive. The collector-emitter current flowing through the windings 50 and 50′ is much greater in magnitude than those currents which are induced therein, and consequently the resultant current in the windings 50, 50′ flows in opposite directions as one or another of the sets of transistors 6, 8 or 6′, 8′ are conductive.

The resistors 32 and 32′ are present in order to limit the base current for the transistors 6 and 6′ respectively during the time that those transistors are turning on, since during that time the base-emitter junctions of those transistors are effectively shorted. The function of the rectifiers 54, 56 and 54′, 56′ is to bypass the resistors 32, 32′ respectively during such time as their respective transistors are to be turned off, thus permitting a large turn-off current to flow, as induced by the windings 36, 36′ respectively, unlimited by the resistor 32, 32′ respectively.

The starting circuit for the flux oscillator, generally designated B, is primarily contained within the area surrounded by the broken line 63. It comprises an oscillator stage generally designated 64, preferably in the form of a free running multivibrator circuit, an amplifier stage generally designated 66 which amplifies the oscillatory pulses emanating from the oscillator stage 64, and a starting-pulse-forming stage generally designated 68 which is actuated by the amplifier 66 and which is operatively connected to the base 30 of the transistor 6 in the circuit 2 of the flux-oscillator A. A disabling means, generally designated 70, is operatively connected between the output circuit of the flux oscillator A and the amplifier stage 66, and is effective to disable the amplifier stage 66, and thus prevent the generation of starting pulses, once the flux oscillator is properly oscillating.

The oscillator stage 64, in the form here specifically disclosed, comprises a uni-junction transistor 72 having base electrodes 74 and 76 and emitter electrode 78. Line 80 is at some reference potential such as ground. Terminal 82 is connected to a source of positive DC bias, such as 24 volts. A manual starting switch 84, a resistor 86, and a pair of five-volt Zener diodes 88 and 90 are connected between terminal 82 and line 80, the Zener diodes 88 and 90 thereby providing a reference voltage, such as 10 volts, for the line 92 relative to the line 80. Connected between lines 92 and 80 are resistor 94 and capacitor 96, the uni-junction transistor emitter electrode 78 being connected to point 98 between the elements 94 and 96. Transistor electrode 74 is connected by resistor 100 to line 92 and transistor electrode 76 is connected by resistor 102 to line 80. The output of this free running multivibrator circuit typically will have a wave form such as is indicated at 103.

The base 104 of amplifier transistor 106 is connected by lead 108 and resistor 110 to the upper end of resistor 102, and resistor 112 is connected between lead 108 and line 80. The collector 114 of transistor 66 is connected by resistor 116 to line 64 and the emitter 118 of transistor 106 is connected by resistor 120 to line 80. The output 102 from the multivibrator stage 64 will therefore be fed to the base 104 of amplifier transistor 106, and the collector-emitter circuit thereof typically will have the wave form indicated at 122.

The starting-pulse-producing transistor 124 has its base 126 connected by lead 128 to the collector 114 of amplifier transistor 106. The emitter 130 of transistor 124 is connected to line 92. The collector 132 of transistor 124 is connected by lead 134 to the base 30 of the transistor 6 in circuit 2 of the flux oscillator A. The transistor 124 will be operated in a switching mode, either on or off, and its output typically will have the wave form shown at 136. A pulse producing during the on-time of transistor 124 will be applied to the base 30 of the transistor 6 in the flux oscillator circuit A, and will be of a magnitude and sense such as to cause the transistor 6, and hence the transistor 8, to become conductive. This pulse will flow through the rectifier 54, which is poled to permit ready flow thereof. In order to ensure that sufficient voltage bias is applied to the base 30 of transistor 6 so that it will reliably be turned on, an additional rectifier 54*a* is connected in series with the rectifier 54, as shown. This is particularly desirable when, as is here specifically disclosed, more than one transistor is provided in the flux oscillator circuit 2. Since the rectifier 54*a* is required only during starting, it need only be provided in the flux oscillator circuit 2 associated with the transistor 6, and need not be provided in the flux oscillator circuit 4. Although the additional rectifier 54*a* is here shown as separate from the rectifier 54, it will be appreciated that this is not necessary. Instead a single rectifier of appropriate parameter could be employed.

Once the flux oscillator circuit A has started to oscillate it will continue to oscillate without any further external assistance, and at a frequency determined by its circuit components. There is no further need for starting pulses, and the existence of such starting pulses might have an adverse effect upon the oscillation of the flux oscillator. Accordingly the disabling means 70 is provided, which comprises a winding 136 inductively electromagnetically associated with the windings 50 and 50′, as by being the secondary winding on a transformer 138, the primary of which is constituted by the windings 50 and 50′. The winding 136 is center-tapped to reference potential at point 140 by lead 142 and its ends are connected by rectifiers 144 and 146 respectively to lead 148. Lead 148 is connected to the base 104 of amplifier rectifier 106 via forward poled rectifiers 150, resistor 152 and lead 154. The rectifiers 150 prevent operation of the disabling means 70 until the output of the flux oscillator A reaches a predetermined magnitude. A rectifier 156 is connected between the emitter 118 and the base 104 of the transistor 106 in order to protect the base-emitter junction of that transistor against high reverse spike voltages. A filter capacitor 158 is connected between leads 142 and 148.

As a result, when the flux oscillator A is in oscillation a rectified voltage will be generated between lines 142 and 148 which will cause a current to flow through resistors 152 and 112, and that current will so bias the base 104 of the amplifier transistor 106 as to reduce the output therefrom to such a degree that the starting-pulse-producing transistor 124 will remain in off condition despite the oscillation of stage 64, and therefore will not send any pulses to the base 30 of transistor 6. The oscillator stage 64 will continue to function, but because it involves only low power signals, no appreciable power loss or heat production will result.

If for any reason the flux oscillator A should stop oscillating while the oscillator circuit 64 is energized (while the manual switch 84 is closed), or if its output should fall below a predetermined value, the amplifier-disabling signal feedback through lead 148 and resistor 152 will no longer be effective, a new starting pulse will be sent from the transistor 124 to the base 30 of the flux oscillator transistor 6, and the flux oscillator A will again be impulsed into proper oscillation.

The starting circuit B need not be mounted in the same enclosure as the flux oscillator A (although it may be if desired), so that the operating conditions of the two circuits A and B can be made independent of one another. The transistors 6, 8 and 6′, 8′ of the flux oscillator circuit A are not subjected to any extraneous or unnecessary sources of heat, and therefore have their reliability, accuracy and longevity increased. The rectifiers 54, 56, 54′, 56′ and 54a usually have characteristics as to voltage drop which vary with temperature in the same sense as, and to substantially the same comparative magnitude, as the characteristics of the transistors, so that the overall circuit characteristics remain comparatively constant with time and changes in ambient conditions.

Purely by way of example, the following circuit values may be employed for the components of the starting circuit B (the components of the flux oscillator A may be conventional and hence are not here specified):

| | | |
|---|---|---|
| Resistor 86 | ohms | 500 |
| Zener diodes 88, 90 | volts | 5 |
| Resistor 94 | ohms | 10K |
| Capacitor 96 | mf | 300 |
| Uni-junction transistor 72 | | 2N2646 |
| Resistor 100 | ohms | 330 |
| Resistor 102 | do | 330 |
| Transistor 106 | | 2N2270 |
| Resistor 110 | ohms | 100 |
| Resistor 112 | do | 1K |
| Resistor 116 | do | 1K |
| Resistor 120 | do | 120 |
| Transistor 124 | | 2N3250 |
| Rectifiers 144, 146 | | 1N4003 |
| Rectifiers 150 | | 1N4003 |
| Resistor 152 | ohms | 200 |
| Rectifiers 156 | | 1N4003 |
| Capacitor 158 | mf | 68 |

While but a single embodiment of the present invention has been here specifically disclosed, it will be appreciated that many variations may be made therein, all within the scope of the instant invention as defined in the following claims.

I claim:

1. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillators transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, and a resistor in series with the control electrode of each of said flux oscillator transistors, first and second rectifiers bypassing each of said resistors respectively, and a third rectifier in series only with that one of said first and second rectifiers which bypasses the resistor connected to the transistor to which said pulse generating means is connected, said series-connected rectifiers together being of a magnitude such as to provide proper transistor-starting bias on said last mentioned transistor when the output from said pulse generating means is fed thereto.

2. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillator transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, in which said pulse generating means comprises a pulse forming circuit and a separate amplifier operatively connected between said pulse-forming circuit and said control electrode of said flux oscillator transistor, said disabling means being operatively connected only to said amplifier to disable the latter but not said pulse-forming circuit in response to the presence of said predetermined alternating voltage in said output circuit.

3. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillator transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, said pulse generating means comprising a pulse-forming circuit and an amplifier operatively connected between said pulse-forming circuit and said control electrode of said flux oscillator transistor, said disabling means being operatively connected to said amplifier to disable the latter in response to the presence of said predetermined alternating voltage in said output circuit, and a resistor in series with the control electrode of each of said flux oscillator transistors, first and second rectifiers bypassing each of said resistors respectively, and a third rectifier in series with that one of said first and second rectifiers which bypasses the resistor connected to the transistor to which said pulse generating means is connected, said series-connected rectifiers together being of a magnitude such as to provide proper transistor-starting bias on said last mentioned transistor when the output from said pulse generating means is fed thereto.

4. In the combination of claim 3, a transformer comprising primary and secondary windings, said flux oscillator output circuit comprising said primary winding, said disabling means comprising said secondary winding, a rectifier connected to said secondary winding, and an amplifier-biasing circuit connected between said rectifier and said amplifier and effective to disable said amplifier in response to said predetermined alternating voltage in said primary winding.

5. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillator transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, in which said pulse generating means comprises an oscillator circuit, a separate amplifier operatively connected thereto, and a separate electronic valve operatively connected to said amplifier, the output of said valve being varied by the output of said amplifier and operatively connected to said control electrode of said flux oscillator transistor, said disabling means being operatively connected only to said amplifier to disable the latter but not said oscillator circuit in response to the presence of said predetermined alternating voltage in said output circuit.

6. In the combination of claim 5, a resistor in series with the control electrode of each of said flux oscillator transistors, first and second rectifiers bypassing each of said resistors respectively, and a third rectifier in series with that one of said first and second rectifiers which bypasses the resistor connected to the transistor to which said pulse generating means is connected, said series-connected rectifiers together being of a magnitude such as to provide proper transistor-starting bias on said last mentioned transistor when the output from said pulse generating means is fed thereto.

7. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillator transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, said pulse generating means comprising an oscillator circuit, an amplifier operatively connected thereto, and a switching electronic valve operatively connected to said amplifier and switched between "on" and "off" conditions by the output of said amplifier, the output of said switching electronic valve being operatively connected to said control electrode of said flux oscillator transistor, said disabling means being operatively connected to said amplifier to disable the latter in response to the presence of said predetermined alternating voltage in said output circuit, and a resistor in series with the control electrode of each of said flux oscillator transistors, first and second rectifiers bypassing each of said resistors respectively, and a third rectifier in series with that one of said first and second rectifiers which bypasses the resistor connected to the transistor to which said pulse generating means is connected, said series-connected rectifiers together being of a magnitude such as to provide proper transistor-starting bias on said last mentioned transistor when the output from said pulse generating means is fed thereto.

8. In the combination of claim 7, a transformer comprising primary and secondary windings, said flux oscillator output circuit comprising said primary winding, said disabling means comprising said secondary winding, a rectifier connected to said secondary winding, and an amplifier-biasing circuit connected between said rectifier and said amplifier and effective to disable said amplifier in response to said predetermined alternating voltage in said primary winding.

9. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillator transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, in which said pulse generating means comprises an oscillator circuit, a separate amplifier operatively connected thereto, and a separate switching transistor operatively connected to said amplifier and switched between "on" and "off" conditions by the output of said amplifier, the output of said switching transistor being operatively connected to said control electrode of said flux oscillator transistor, said disabling means being operatively connected only to said amplifier to disable the latter but not said oscillator circuit in response to the presence of said predetermined alternating voltage in said output circuit.

10. In the combination of claim 9, a resistor in series with the control electrode of each of said flux oscillator transistors, first and second rectifiers bypassing each of said resistors respectively, and a third rectifier in series with that one of said first and second rectifiers which bypasses the resistor connected to the transistor to which said pulse generating means is connected, said series-connected rectifiers together being of a magnitude such as to provide proper transistor-starting bias on said last mentioned transistor when the output from said pulse generating means is fed thereto.

11. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillator transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, in which said pulse generating means comprises a free-running multi-vibrator circuit, a separate transistor amplifier operatively connected thereto, and a separate transistor operatively connected to said amplifier, the output of said transistor being varied by the output of said amplifier and operatively connected to said control electrode of said flux oscillator transistor, said disabling means being operatively connected only to said amplifier to disable the latter but not said free-running multivibrator circuit in response to the presence of said predetermined alternating voltage in said output circuit.

12. In the combination of claim 11, a resistor in series with the control electrode of each of said flux oscillator transistors, first and second rectifiers bypassing each of said resistors respectively, and a third rectifier in series with that of one of said first and second rectifiers which bypasses the resistor connected to the transistor to which said pulse generating means is connected, said series-connected rectifiers together being of a magnitude such as to provide proper transistor-starting bias on said last mentioned transistor when the output from said pulse generating means is fed thereto.

13. A starting circuit for use in combination with a flux oscillator comprising a pair of circuits each comprising a transistor having electrodes one of which comprises a control electrode, a coil connected to each control electrode, the other electrodes of said transistors being connected in an output circuit, said coils being operatively connected to said output circuit so that said transistors are alternately rendered conductive, thereby to cause an alternating voltage to appear in said output circuit; said starting circuit comprising pulse generating means, means for actuating said pulse generating means, means connecting said pulse generating means to the control electrode of one of said flux oscillator transistors in a sense such that the pulse output of said generating means will bias said transistor conductive, and disabling means operatively connected between said output circuit and said pulse generating means and effective to render said pulse generating means ineffective in response to the presence of a predetermined alternating voltage in said output circuit, in which said pulse generating means comprises a free-running multivibrator circuit, a transistor amplifier operatively connected thereto, and a switching transistor operatively connected to said amplifier and switched between "on" and "off" conditions by the output of said amplifier, the output of said switching transistor being operatively connected to said control electrode of said flux oscillator transistor, said disabling means being operatively connected to said amplifier to disable the latter in response to the presence of said alternating voltage in said output circuit, and a resistor in series with the control electrode of each of said flux oscillator transistors, first and second rectifiers bypassing each of said resistors respectively, and a third rectifier in series with that one of said first and and second rectifiers which bypasses the resistor connected to the transistor to which said pulse generating means is connected, said series-connected rectifiers together being of a magnitude such as to provide proper transistor-starting bias on said last mentioned transistor when the output from said pulse generating means is fed thereto.

14. In the combination of claim 13, a transformer comprising primary and secondary windings, said flux oscillator output circuit comprising said primary winding, said disabling means comprising said secondary winding, a rectifier connected to said secondary winding, and an amplifier-biasing circuit connected between said rectifier and said amplifier and effective to disable said amplifier in response to said predetermined alternating voltage in said primary winding.

References Cited

UNITED STATES PATENTS

| | | | |
|---|---|---|---|
| 3,085,211 | 4/1963 | Jensen et al. | 331—113 X |
| 3,176,242 | 3/1965 | Dyer et al. | 331—113 |
| 3,247,466 | 3/1966 | Mayer | 331—113 X |

ROY LAKE, *Primary Examiner.*

J. B. MULLINS, *Assistant Examiner.*